United States Patent [19]
Hanawa

[11] Patent Number: 6,027,601
[45] Date of Patent: *Feb. 22, 2000

[54] AUTOMATIC FREQUENCY TUNING OF AN RF PLASMA SOURCE OF AN INDUCTIVELY COUPLED PLASMA REACTOR

[75] Inventor: Hiroji Hanawa, Sunnyvale, Calif.

[73] Assignee: Applied Materials, Inc, Santa Clara, Calif.

[*] Notice: This patent is subject to a terminal disclaimer.

[21] Appl. No.: 08/886,841

[22] Filed: Jul. 1, 1997

Related U.S. Application Data

[62] Division of application No. 08/389,888, Feb. 15, 1998, Pat. No. 5,688,357.
[51] Int. Cl.[7] .................................................. H05H 1/00
[52] U.S. Cl. .............. 156/345; 118/723 I; 315/111.21; 216/68; 216/61
[58] Field of Search .................... 156/345; 118/723 I, 118/723 IR, 723 E, 723 R; 315/111.21; 204/298.34, 298.31, 298.08; 216/68, 61

[56] References Cited

U.S. PATENT DOCUMENTS

| | | | |
|---|---|---|---|
| 5,556,549 | 9/1996 | Patrick et al. | 156/345 |
| 5,571,366 | 11/1996 | Ishii et al. | 156/345 |
| 5,849,136 | 12/1998 | Mintz et al. | 156/345 |

*Primary Examiner*—Thi Dang
*Attorney, Agent, or Firm*—Michaelson and Wallace

[57] ABSTRACT

A plasma reactor has a reactor chamber for containing a semiconductor wafer to be processed and gas inlet apparatus for introducing an ionizable gas into the chamber, a variable frequency RF power source, an RF antenna near the chamber, the antenna connected to the RF power source for coupling RF power to the ionizable gas to produce a plasma therefrom, a power sensor connected to the antenna for sensing either (or both) transmitted power to the plasma or reflected power to said source, and a control circuit connected to a control input of the variable frequency RF power source and responsive to the power sensor for changing the frequency of the variable frequency RF power source so as to either increase the transmitted power or decrease the reflected power, so as to provide an accurate RF match instantly responsive to changes in plasma impedance.

32 Claims, 13 Drawing Sheets

AUTOMATIC FREQUENCY TUNING OF AN RF PLASMA SOURCE OF AN INDUCTIVELY COUPLED PLASMA REACTOR

This is a division of application Ser. No. 08/389,888, filed Feb. 15, 1995 now U.S. Pat. No. 5,688,357.

BACKGROUND OF THE INVENTION

1. Technical Field

The present invention is related to inductively coupled RF plasma reactors used in semiconductor processing, of the type employing a coiled antenna to couple RF power to the plasma reactor chamber, and in particular to methods for turning the RF power circuit (including the coil antenna) in response to impedance changes in the plasma.

2. Background Art

An inductively coupled plasma reactor typically has a coiled antenna adjacent the plasma reactor chamber and an RF generator connected through an impedance match circuit and a 50 Ohm cable to the coiled antenna. As disclosed in U.S. patent application Ser. No. 08/277,531 filed Jul. 18, 1994 by Gerald Yin et al. entitled PLASMA REACTOR WITH MULTI-SECTION RF COIL AND ISOLATED CONDUCTING LID and assigned to the assignee of the present application, such an inductively coupled plasma reactor may have a ceiling over which the coiled antenna is wound. In carrying out semiconductor processes such as metal etching, as one example, the amount of power applied to the plasma in the chamber is a critical parameter and is selected with great care. Any significant deviation from the selected power level may so change the process as to reduce product yield, as is well-known to those skilled in the art. For example, the plasma density, which affects etch rate, is a function of the power coupled to the plasma.

The RF impedance presented by the plasma fluctuates during processing. Unless the RF match circuit is able to compensate for such fluctuations, an RF mis-match arises between the RF source and the plasma, so that some of the RF power is reflected back to the source rather than being coupled to the plasma. Plasma impedance fluctuations during RF plasma processing on the order of 5% are typical. In order to enable the RF match circuit to compensate or follow such fluctuations and maintain an RF match condition, the RF match circuit includes variable capacitors controlled by electric motor servos governed by an RF detector circuit. The RF detector circuit responds to changes in reflected power by changing the variable capacitors to maintain RF match between the RF source and the plasma.

One problem with this approach is that the electric motor servos and variable capacitors are expensive and heavy. A related problem is that it is difficult to compensate for large fluctuations in plasma impedance using electric motor servos and variable capacitors. A further problem is that the electric motor servos are relatively slow and unreliable (being subject to mechanical breakdown). What is needed is a device for instantly responding to wide fluctuations in plasma impedance to maintain RF match without employing heavy or expensive mechanical devices or variable capacitors.

SUMMARY OF THE INVENTION

The invention is embodied in an RF plasma reactor having a reactor chamber for containing a semiconductor substrate to be processed and gas inlet apparatus for introducing an ionizable gas into the chamber, a variable frequency RF power source, an RF antenna near the chamber, the antenna connected to the RF power source for coupling RF power to the ionizable gas to produce a plasma therefrom, a power sensor connected to the antenna for sensing either (or both) transmitted power to the plasma or reflected power to said source, and a control circuit connected to a control input of the variable frequency RF power source and responsive to the power sensor for changing the frequency of the variable frequency RF power source so as to either increase the transmitted power or decrease the reflected power, so as to provide an accurate RF match instantly responsive to changes in plasma impedance.

DETAILED DESCRIPTION OF THE INVENTION

Figures 1, 4:
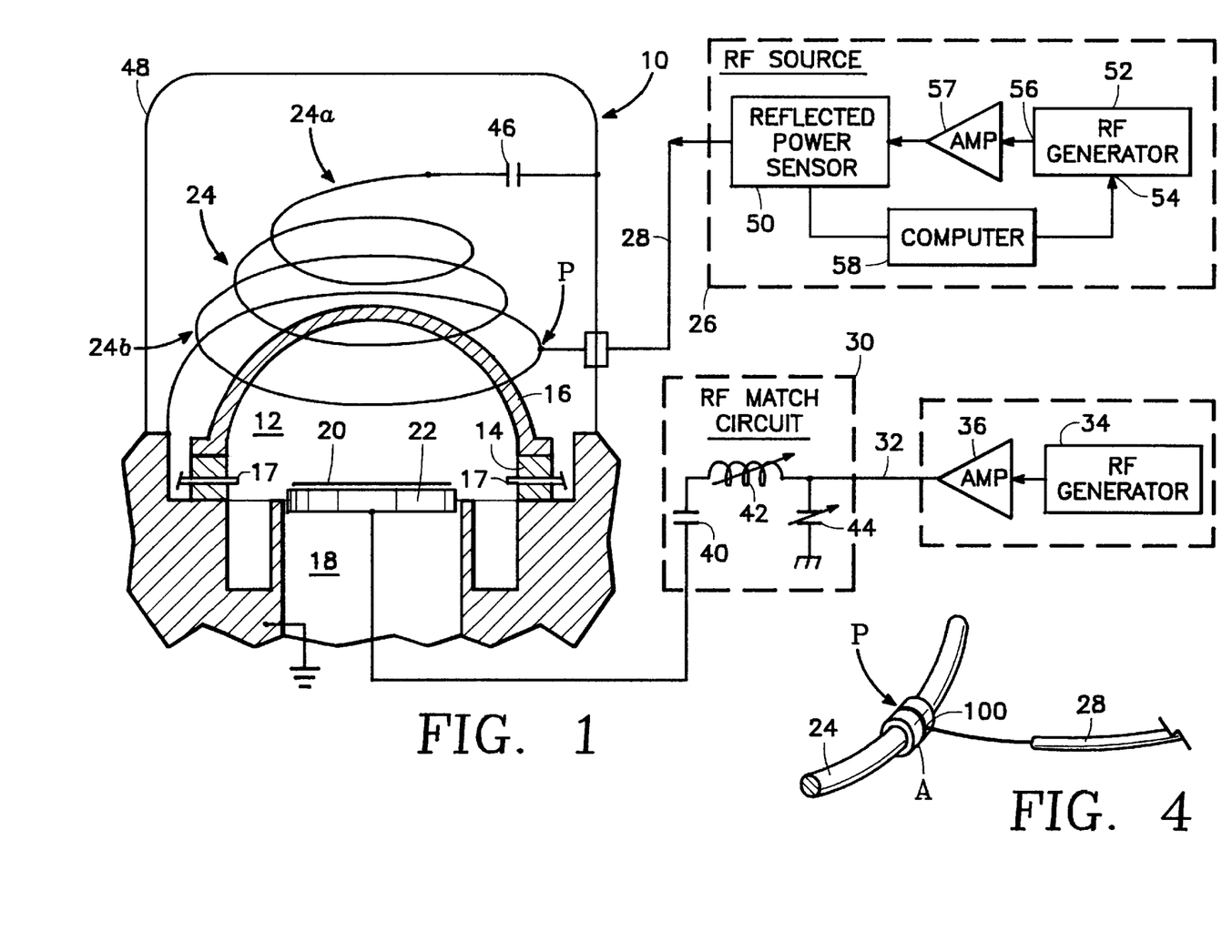
FIG. 1 is a schematic diagram of an RF plasma reactor system including the present invention.
FIG. 4 illustrates a translatable RF connector employed in the embodiment of FIG. 1.

Referring now to FIG. 1, an inductively coupled RF plasma reactor 10 includes a sealed reactor chamber 12 bounded by a generally cylindrical conductive (metal) side wall 14 and a dielectric (quartz) dome-shaped ceiling 16. Gas inlet apparatus 17 coupled to a gas supply provides an ionizable processing gas into the interior of the chamber 12. A wafer pedestal 18 in the middle of the chamber supports a semiconductor wafer 20 on an isolated conductive top 22. RF power is coupled to the plasma in the chamber 10 by a coiled antenna 24 wound around the exterior of the dome-shaped ceiling 16. The coil 24 is connected to a matched RF source 26 via a 50-Ohm cable 28. In order to control plasma ion energy, the wafer pedestal base 22 is connected through an RF match circuit 30 and a 50-Ohm cable 32 to an RF generator 34 and amplifier 36. In one implementation, he RF match circuit 30 includes a series 100-picoFarad capacitor 40, a series variable inductor 42 (nominally 3 microHenries) and a variable shunt capacitor 44 (nominally 1200 picoFarads). However, it should be understood that these values will vary depending upon specific plasma reactor design choices, and are readily determined by the skilled worker for a particular reactor design. A conventional vacuum pump (not shown) maintains the interior of the chamber 12 at a desired pressure (e.g., between 0 and 100 milliTorr.

In accordance with one aspect of the invention, no separate RF match circuit (such as the RF match circuit 30) is required to match the RF source 26 to the load. Instead, a match is achieved by employing the coil antenna 24 itself as a fixed RF match reactance. For this purpose, the power cable from the RF source 26 is connected through a slidable conductor attachment A (FIG. 4) to an intermediate point P (FIG. 1) on the coil antenna 24. The point P divides the coil antenna 24 into two windings, a top winding 24a and a bottom winding 24b. The end of the top winding 24a is grounded through a high voltage capacitor 46 to an RF shield 48 surrounding the coil antenna 24. In the illustrated implementation, the high voltage capacitor 46 was 500 picoFarads. The end of the bottom winding 24b is grounded directly to the RF shield 48. A perfect RF match is achieved by sliding the slidable attachment A to vary the location of the attachment point P along the conductor of the coil antenna 24 while continuously measuring RF power reflected back to the RF source until the reflected RF power is minimized. For this purpose, the skilled worker may connect a conventional power meter such as the reflected power sensor 50 at the output of the RF source 26. Such a conventional power meter typically provides continuous measurements of both reflected power and transmitted power. As is well-known to those skilled in the art, such a power meter is readily implemented with a conventional RF dual direction coupler circuit. It should be noted that the worker may have to try sliding the attachment A in both directions to determine which direction is the correct one in which to move the slidable attachment A.

Of course, once a plasma is ignited within the chamber 12, the RF match condition may be lost as the plasma impedance fluctuates. Therefore, it is necessary to compensate for such fluctuations to maintain RF match between the RF source 26 and the load or chamber 12. For this purpose, the RF source 26 employs a conventional variable-frequency RF generator 52 having a frequency control input 54 and power output 56 with an amplifier 57 and a computer 58. The computer 58 monitors the reflected power level measured by the reflected power sensor 50 and applies a control signal to the frequency control input 54 of the variable-frequency RF generator 52. In one implementation the RF generator is a voltage-controlled oscillator and the computer 58 changes the output frequency of the generator 52 by varying the voltage applied to the control input 54. In other implementations of the invention, any device capable of performing the above-described control tasks of the computer 58, such as a programmed logic array or an analog control circuit, may be employed in lieu thereof.

Figure 2:
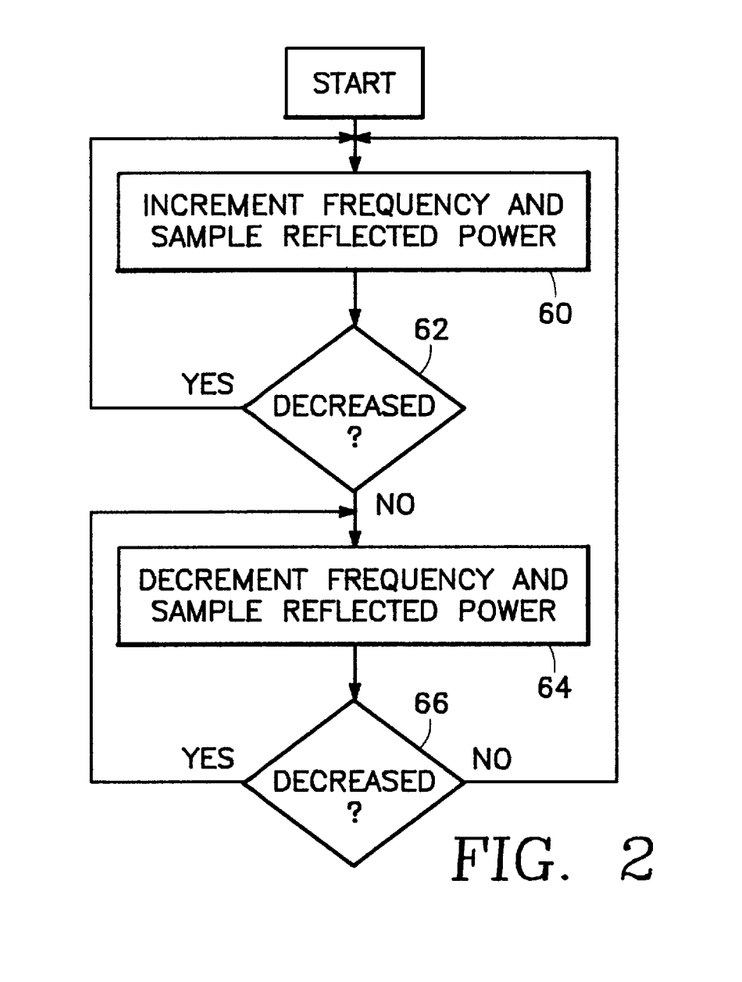
FIG. 2 is a block flow diagram illustrating a frequency control process carried out by logic in the system of FIG. 1.

The computer 58 (which is preferably a conventional microprocessor with a programmable read-only memory) is programmed to vary the frequency of the RF generator 52 so as to continuously minimize the amount of reflected power measured by the reflected power sensor 50. One algorithm with which the computer 58 may be programmed to accomplish this purpose is illustrated in FIG. 2. The successive steps of the algorithm of FIG. 2 are performed serially during successive execution cycles of the computer 58. First, the frequency of the RF generator 52 is incremented (increased by a predetermined amount) and the reflected RF power is then sampled (block 60 of FIG. 2). The computer 58 then makes a decision (block 62 of FIG. 2): If the current samples reflected RF power is less than the previous sample (YES branch of block 62), then the incrementing the sampling step of block 60 is repeated. Otherwise (NO branch of block 70), the next step (block 64) is to decrement the frequency and again sample the reflected RF power. Again, the computer makes a decision (block 66): If the reflected RF power has decreased (YES branch of block 66), then the decrementing and sampling step of block 64 is repeated. Otherwise, (NO branch of block 66), the algorithm returns to the incrementing and sampling step of block 60.

The result is that in response to any large fluctuation in plasma impedance, either the frequency incrementing step of block 60 will be repeated many times until RF match is reached or else the frequency decrementing step of block 64 will be repeated many times until RF match is reached. At RF match, the algorithm dithers between alternating frequency decrementing and frequency incrementing steps.

In the illustrated implementation, the nominal frequency of the RF source 26 was 2.0 MHz. Typical plasma impedance fluctuations require a 5% increase or decrease in that frequency to maintain RF match. Such a fractional change in frequency does not appreciably affect the processing characteristics of the plasma reactor. The computer 58 increments or decrements the output frequency of the RF generator 52 preferably in 0.01 MHz steps, so that the entire range of frequency variations is covered in 100 execution cycles of the computer. Since the computer 58 may be expected to operate at MegaHertz rates, the response to any plasma impedance fluctuations is virtually instantaneous, compared with the slow response of prior art variable capacitors and electric motor servos.

The invention thus eliminates not only the need for variable capacitors and electric motor servos in the RF match circuit, but also eliminates the entire RF match circuit itself, exploiting the coil antenna 24 to obtain the needed reactance for an RF match between the chamber 10 and the RF source 26.

In operation, a nominal or initial RF match is obtained prior to plasma ignition by moving the connection point P until reflected RF power measured by the sensor 50 is minimized. Then, after the plasma is ignited in the chamber 10, the computer 58 controls the frequency of the RF generator 52 to compensate for the plasma impedance and any changes in plasma impedance. Preferably, if it is determined, for example, that an RF match is expected to obtain at a nominal output frequency of the RF source 26 of 2.0 MHZ, then frequency of the RF source 26 is set at slightly below the expected match frequency of 2.0 MHz (e.g., 1.7 MHz) when the plasma if ignited, so that the computer 58 increases the frequency until RF match (minimum reflected RF power) is obtained.

In the illustrated embodiment, the coil antenna 24 had an inductance of 10 microHenries and the attachment point P was located such that the ratio of the number of windings in the top winding 24a and the bottom winding 24b approximately 8:2.

Figure 3:
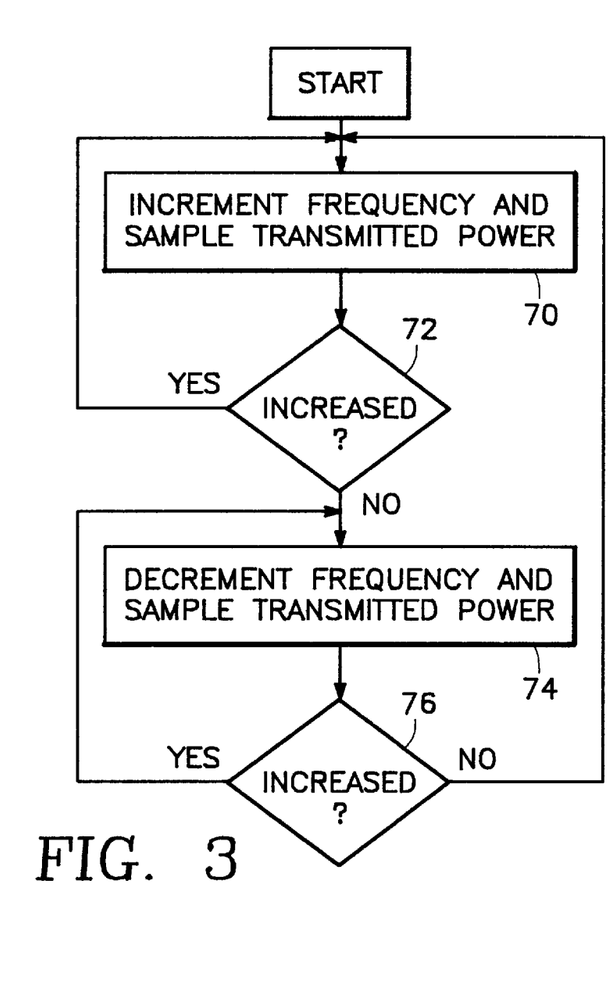
FIG. 3 is a block flow diagram illustrating a frequency control process carried out by logic in an alternative embodiment of the system of FIG. 1.

While the invention has been described with reference to an embodiment in which the computer 58 samples the reflected power measured by the sensor 50 and strives the minimize that power in the algorithm of FIG. 2, in an alternative embodiment the computer samples transmitted power measured by the sensor 50 and strives to maximize that measurement. In this alternative embodiment, the algorithm of FIG. 2 is modified to change the "decrease?" inquiries of steps 62 and 66 to "increase?" inquiries, as illustrated in FIG. 3. Thus, in FIG. 3, the frequency is incremented and the transmitted power is sampled (block 70 of FIG. 3). If this results in an increase in transmitted power (YES branch of block 72) then the step is repeated. Otherwise (NO branch of block 72), the frequency is decremented and the transmitted power sampled thereafter (block 74). If this results in an increase in transmitted power (YES branch of block 76, then this step is repeated. Otherwise (NO branch of block 76), the process returns to the initial step of block 70.

While the invention has been described with reference to an embodiment in which the RF match circuit is eliminated, a separate RF match circuit may be connected at the output of the RF source 26, although no variable reactive components (e.g., variable capacitors) would be required.

FIG. 4 illustrates an implementation of the movable attachment point A, which is a conductive ring 100 around the conductor of the coil antenna 24, the ring 100 maintaining electrical contact with the antenna 24 but being sufficiently loose to permit translation in either direction along the length of the coil antenna 24.

Figure 5:
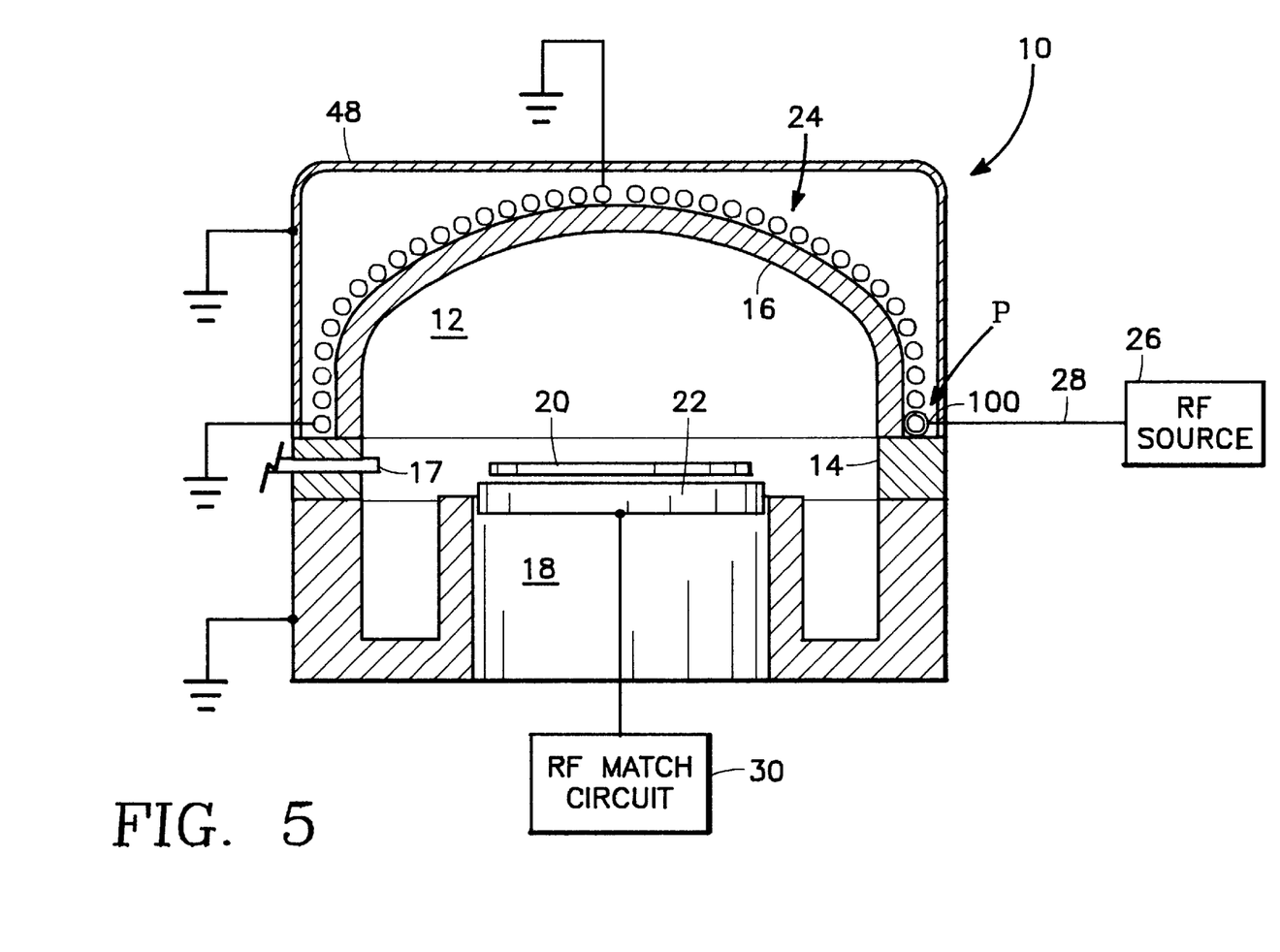
FIGS. 5–11 are simplified diagrams of embodiments of the invention in which the antenna coil has a top section overlying the chamber and a side section surrounding a portion of the chamber.
Figure 6:
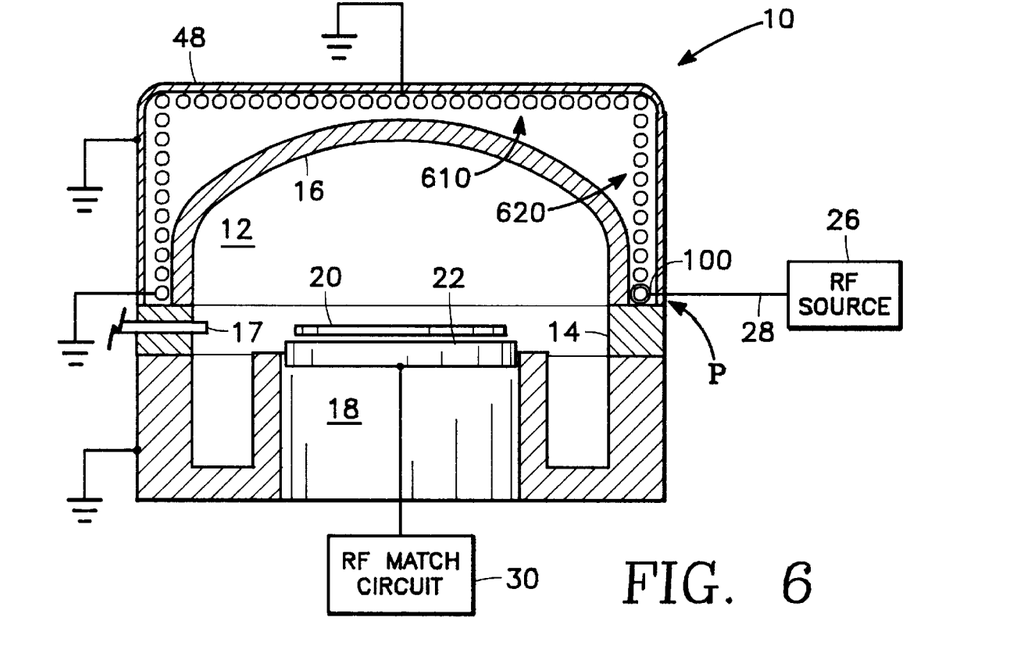
Figure 7:
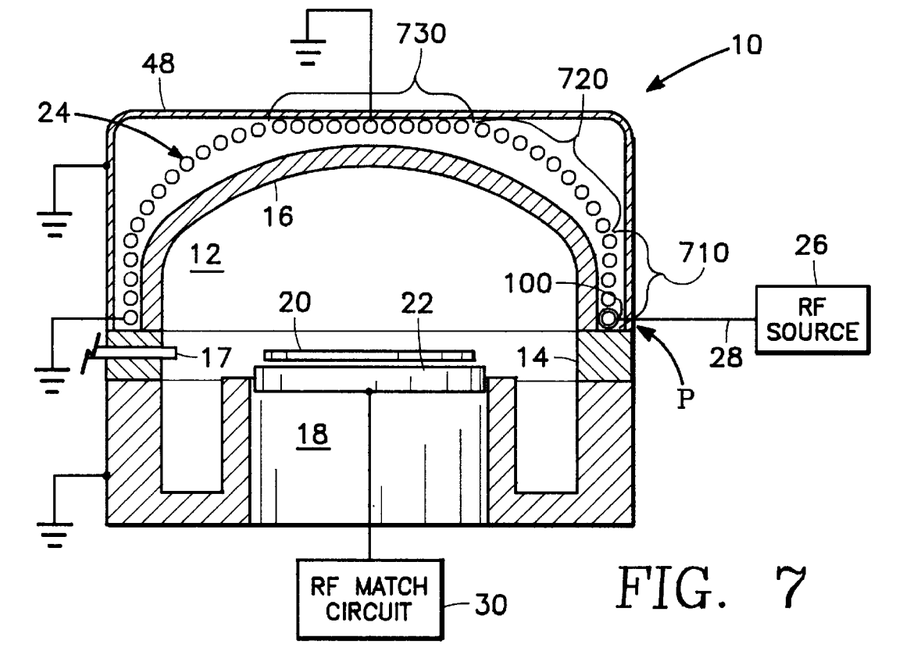
Figure 8:
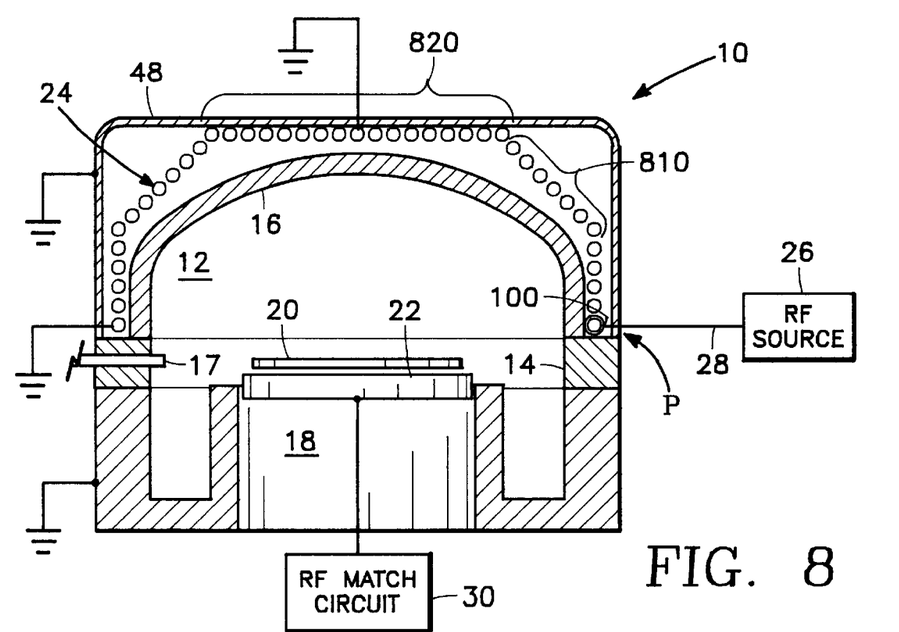
Figure 9:
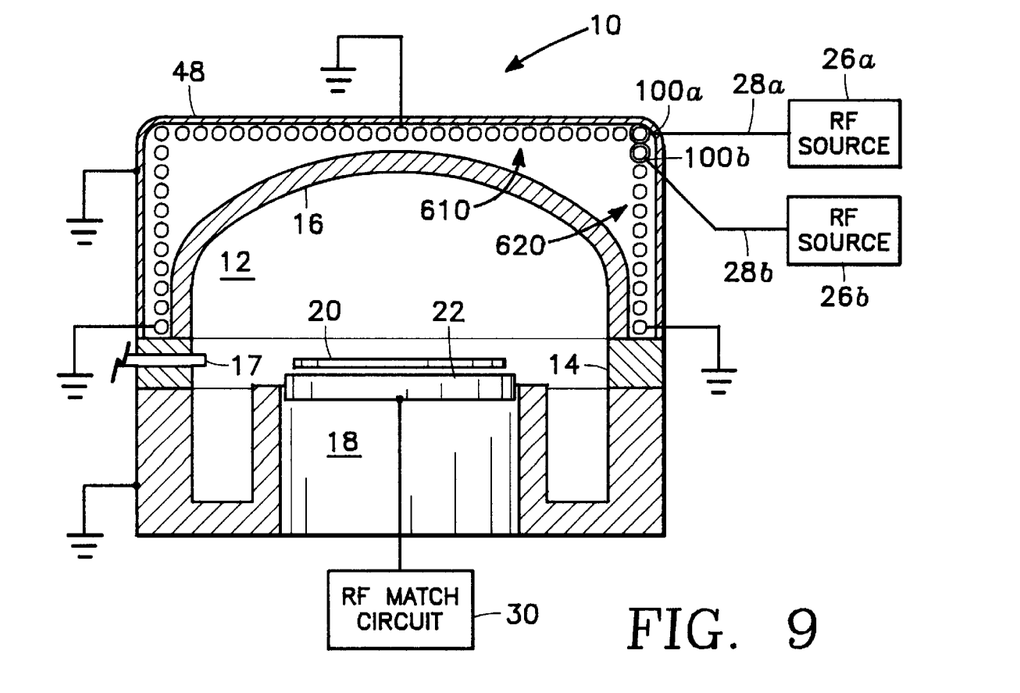
Figure 10:
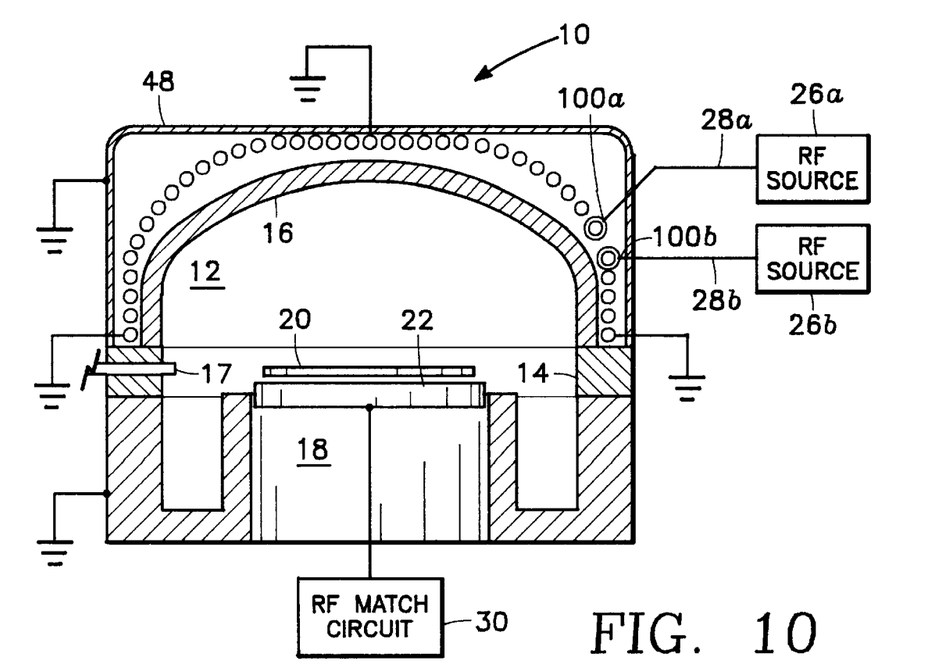
Figure 11:
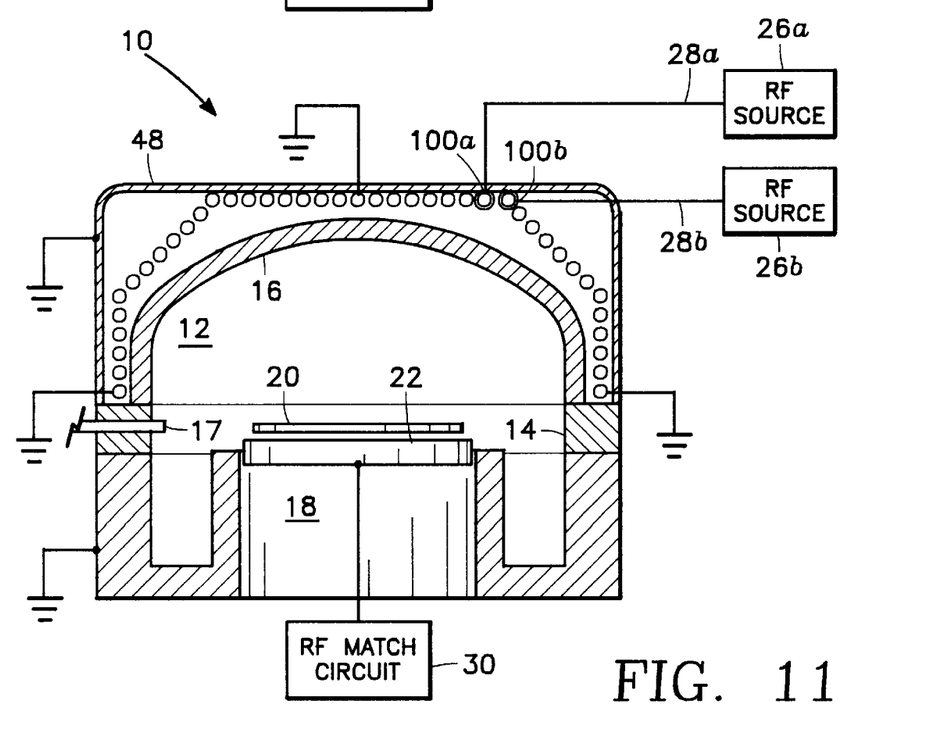

Referring to FIG. 5, the coil antenna 24 may have a multi-radius dome shape, the slide connection conductive ring 100 being on or near the bottom winding of the coil antenna 24. Referring to FIG. 6, the coil antenna 24 may comprise a flat or disk-shaped top portion 610 overlying the chamber and a cylindrical side portion 620 surrounding a portion of the chamber. Referring to FIG. 7, the coil antenna 24 may comprise a lower cylindrical portion 710, an intermediate dome-shaped corner 720 and a flat or discoid top portion 730. Referring to FIG. 8, the coil antenna 24 may comprise a lower truncated conical portion 810 and a flat discoid top 820. Referring to FIG. 9, the coil antenna of FIG. 6 may be divided so that the discoid top winding 610 and the cylindrical winding 620 are separately connected to the R.F. source 26. In the implementation of FIG. 9, the top winding 610 is connected to the R.F. source 26 by a first slide connection ring 100a on or near the outermost winding thereof, while the cylindrical winding is connected to the R.F. source 26 by a second slide connection ring 100b on or near the top winding thereof. Referring to FIG. 10, the coil antenna of FIG. 7 may be divided so that the cylindrical portion 710 is connected at the top winding thereof by the first slide connector ring 100a to the R.F. source 26 while the dome and discoid portions 720, 730 are connected to the R.F. source 26 at the outermost winding thereof by the second slide connector ring 100b. Referring to FIG. 11, the embodiment of FIG. 8 may be divided so that the conical winding 810 is connected on or near its top winding to the R.F. source 26 by the first slide connector ring 100a while the discoid winding 820 is connected at or near its outermost winding to the R.F. source 26 by the second slide connector ring 100b. The embodiments of FIGS. 5–11 incorporate inventions disclosed in U.S. application Ser. No. 08/389,899 filed on Feb. 15, 1995 by Hiroji Hanawa et al. and entitled "RF Plasma Reactor with Hybrid Coil Inductor and Multi-Radius Dome Ceiling" and assigned to the present assignee, the disclosure of which is incorporated herein by reference.

Figure 12:
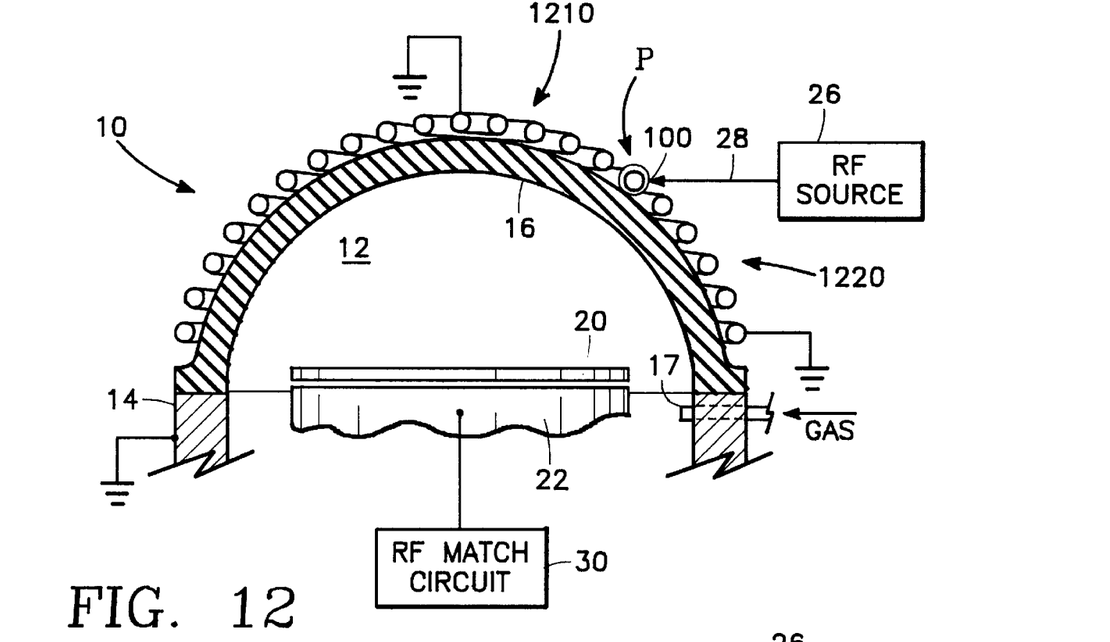
FIGS. 12–17 are simplified diagram of embodiments of the invention in which the antenna coil consists of plural oppositely wound sections joined at common points of connection.
Figure 13:
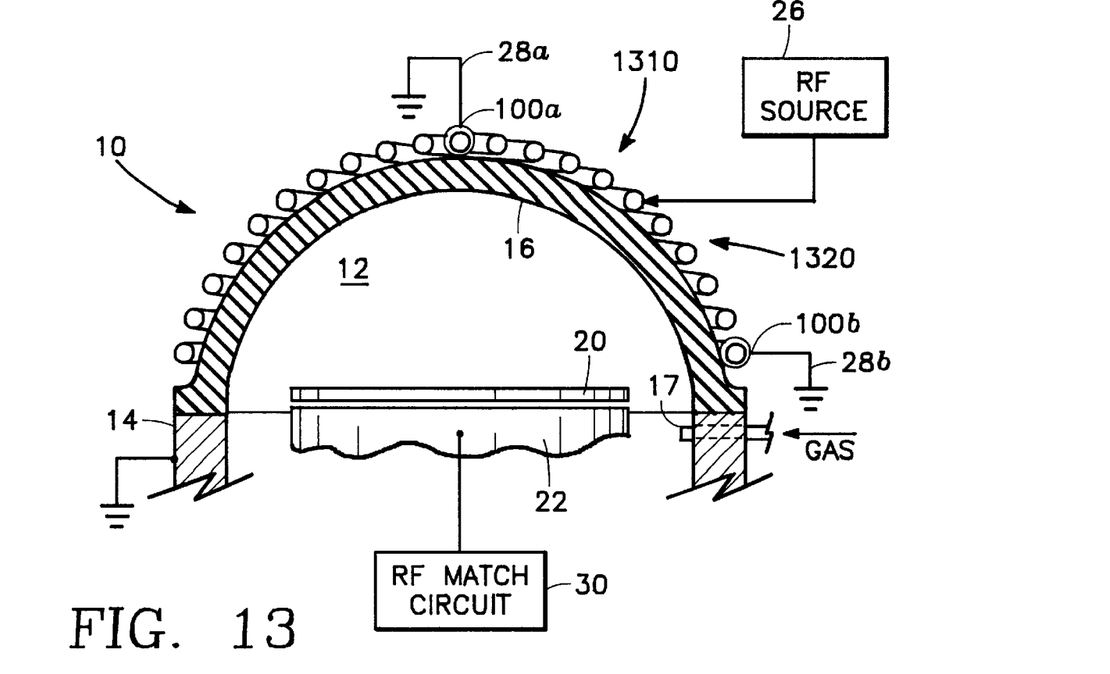
Figure 14:
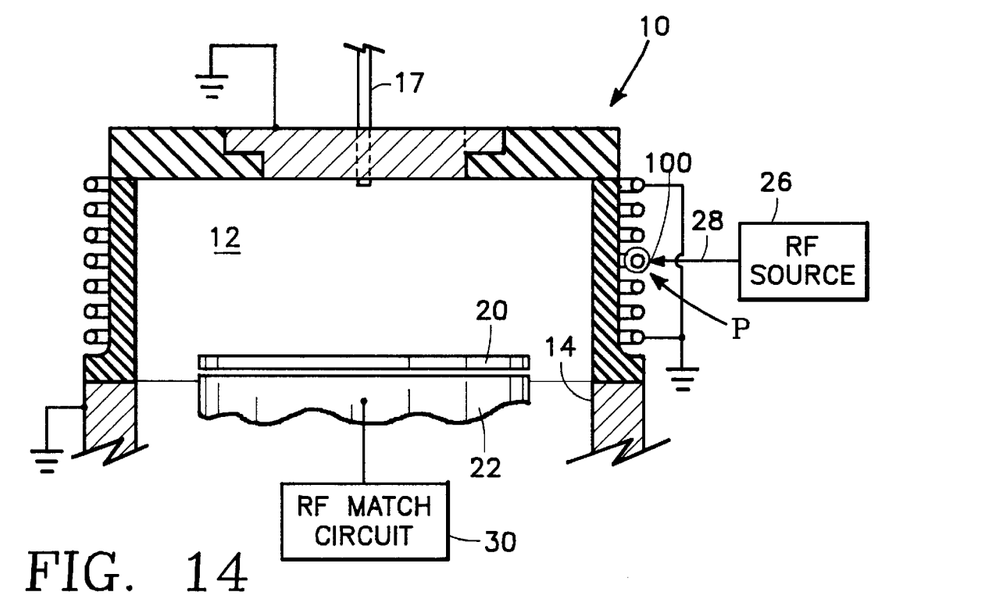
Figure 15:
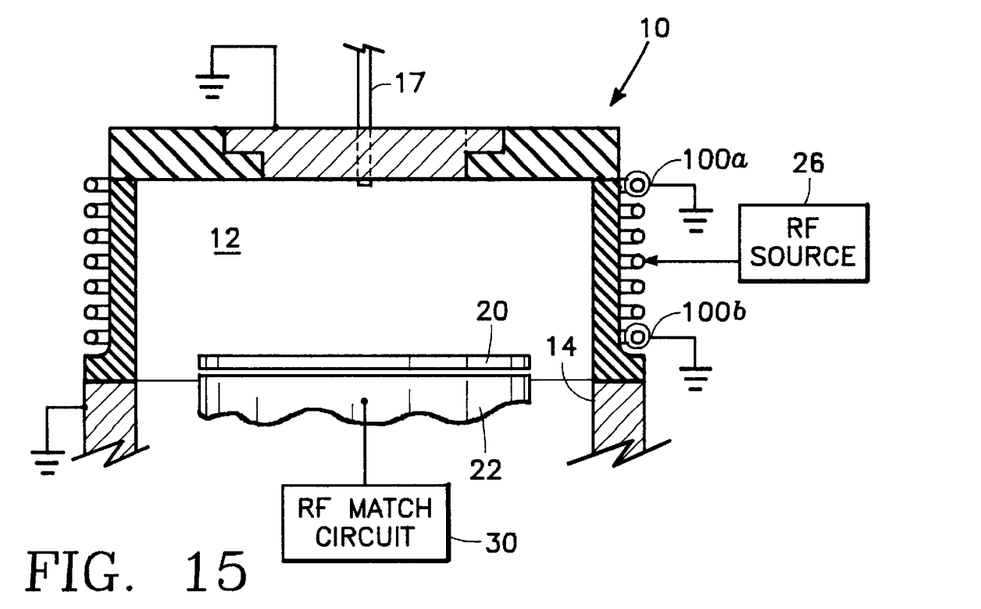
Figure 16:
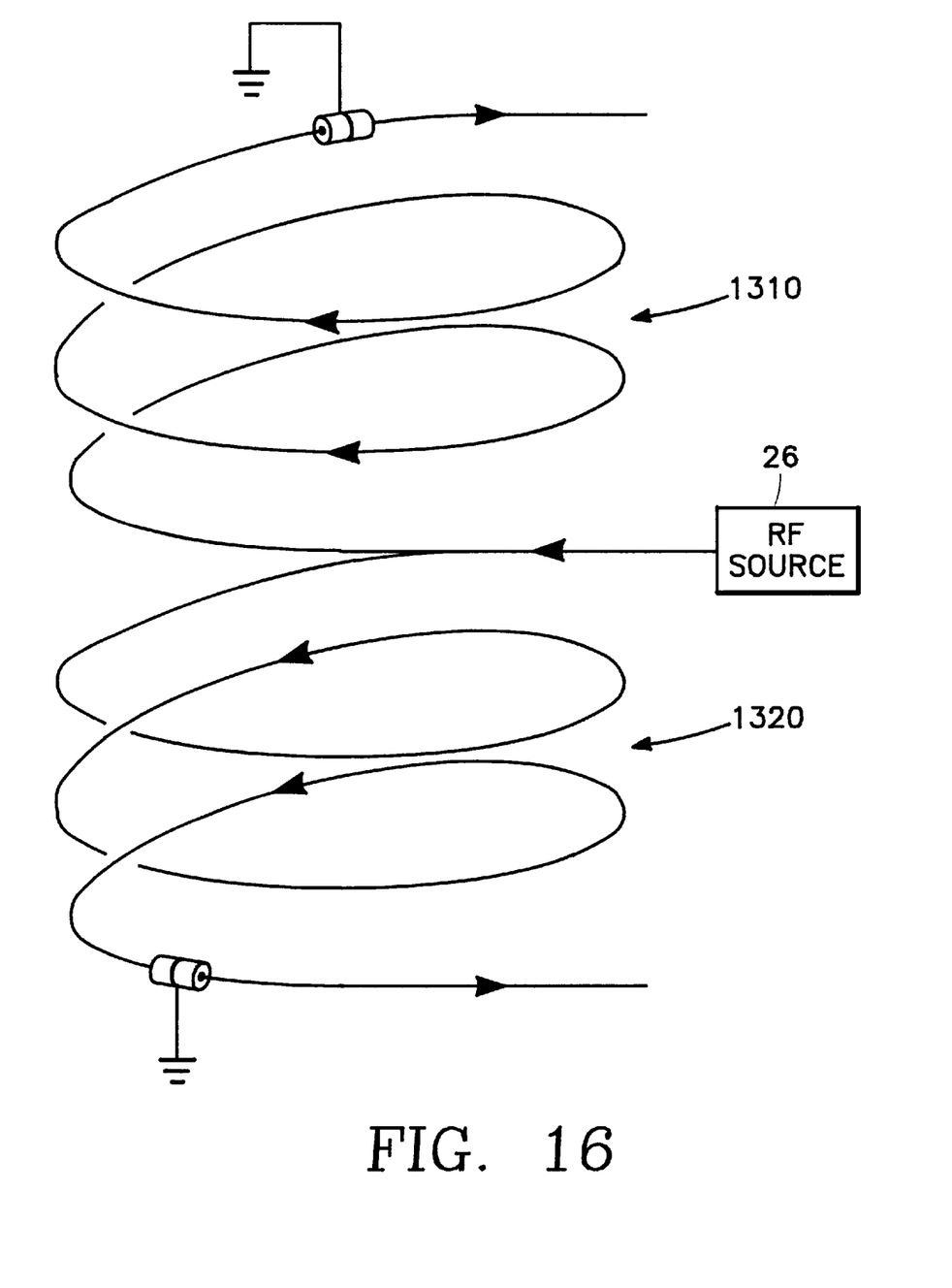
Figure 17:
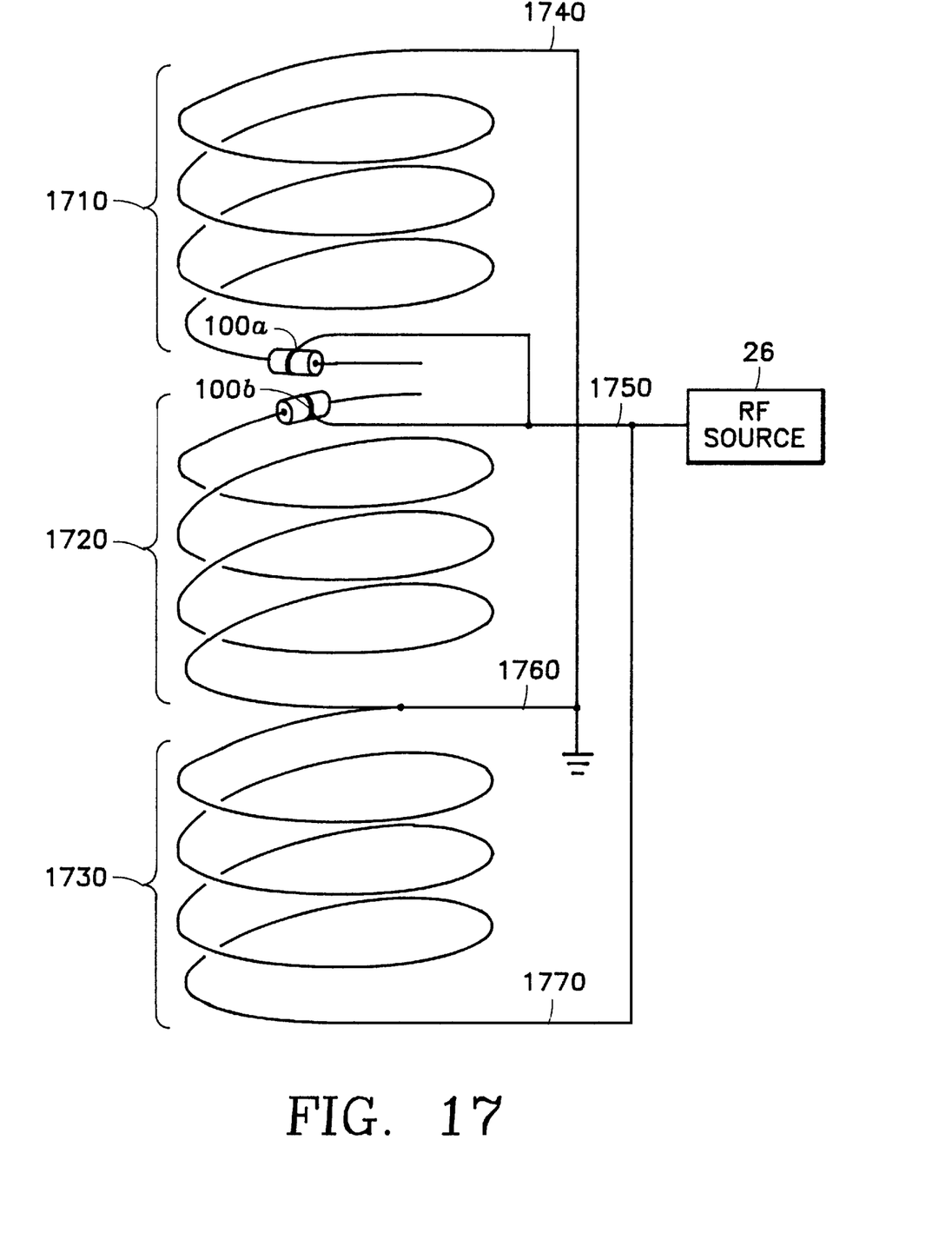

Referring to FIG. 12, the coil antenna 24 may be divided into two oppositely wound sections 1210, 1220 connected at a common point A to the RF source 26 by the slidable connector ring 100, while the top and bottom ends of the coil antenna 24 are grounded. The two sections 1210, 1220 are oppositely wound so that the magnetic flux from each section reinforces that of the other. Referring to FIG. 13, the common connection point of two sections 1310, 1320 is fixed while the connections near the top and bottom ends of the coil antenna 24 comprise the two slidable connection rings 100a, 100b, respectively. While the embodiments of FIGS. 12 and 13 are dome-shaped windings, FIGS. 14 and 15 illustrate cylindrical-shaped windings corresponding to variations of the embodiments of the embodiments of FIGS. 12 and 13, respectively. FIG. 16 is a perspective view of the embodiment of FIG. 15. While each of the embodiments of FIGS. 12–16 is illustrated as having two coil sections with a single common connection point, the perspective view of FIG. 17 illustrates how the same structure may be repeated to provide three (or more) sections 1710, 1720, 1730, each pair of adjacent sections being oppositely wound and having a common connection point (1740, 1750, 1760, 1770) therebetween, alternate common connection points 1750, 1770) being connected to the RF source 26 and remaining common connection points (1740, 1760) being connected to ground. The embodiments of FIGS. 12–17 incorporate inventions disclosed in U.S. application Ser. No. 08/277,531 filed Jul. 18, 1994 by Gerald Z. Yin et al. and entitled "Plasma Reactor with Multi-Section RF Coil and Isolated Conducting Lid" and assigned to the present assignee, the disclosure of which is incorporated herein by reference.

Figure 18:
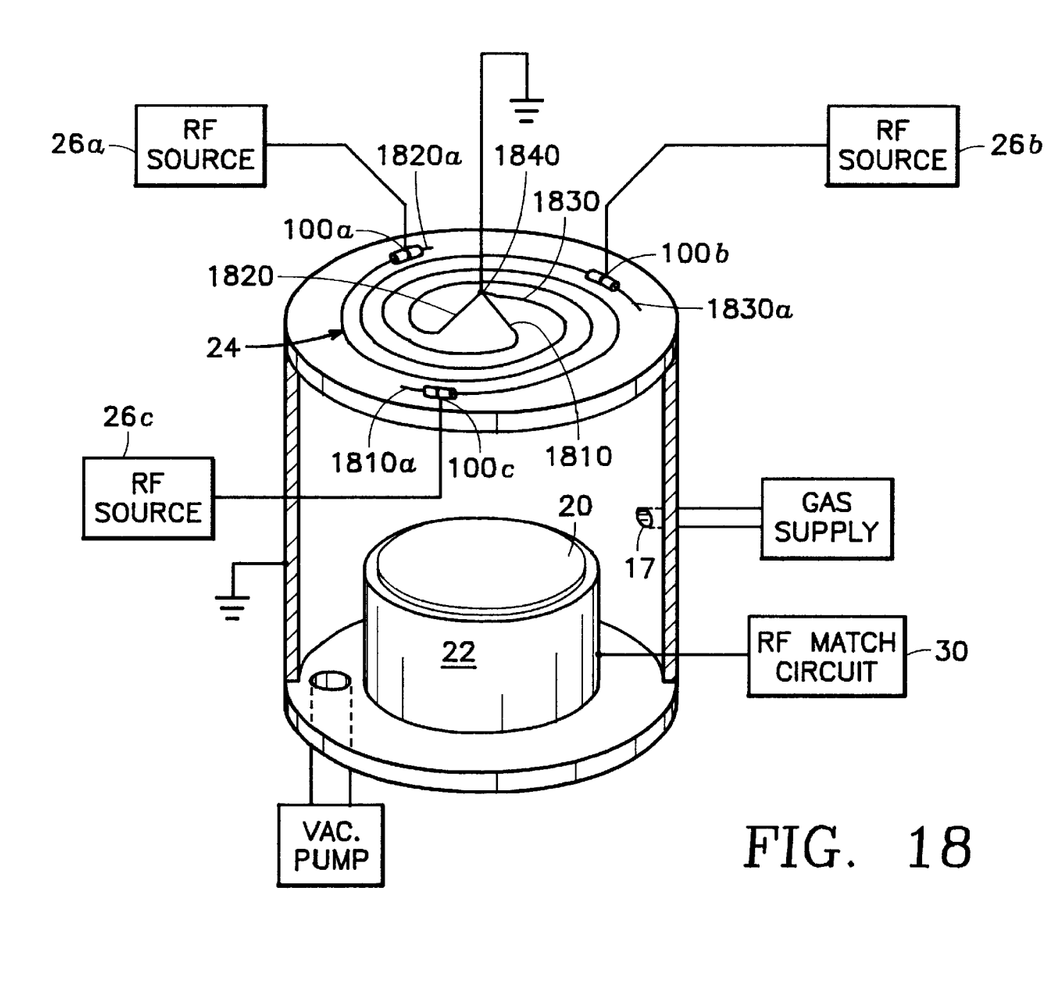
FIGS. 18–21 are simplified diagrams of embodiments of the invention in which the antenna coil consists of plural concentric windings.
Figure 19:
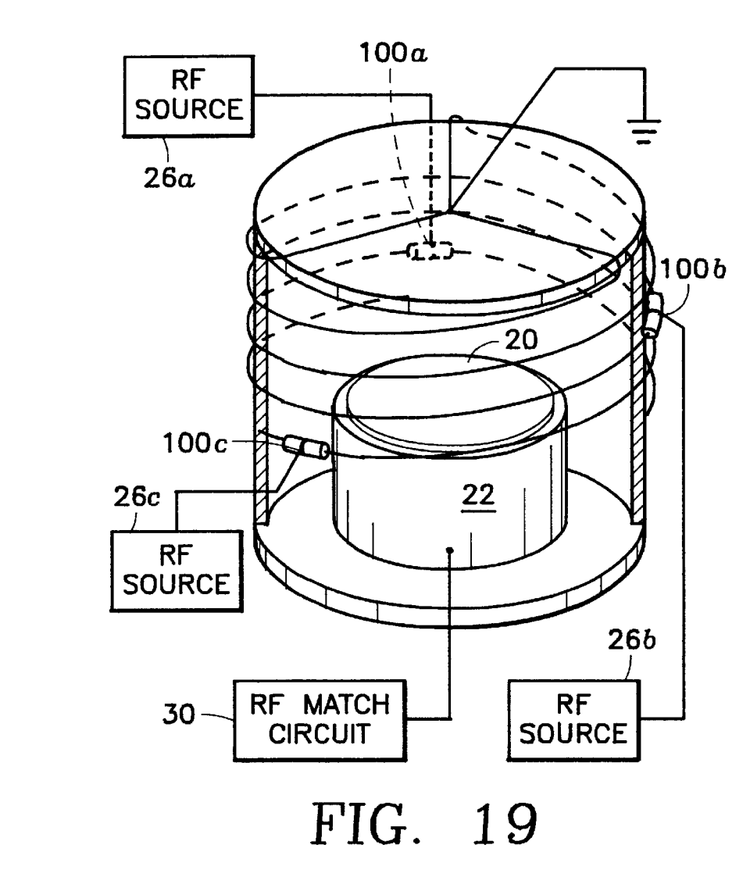
Figure 20:
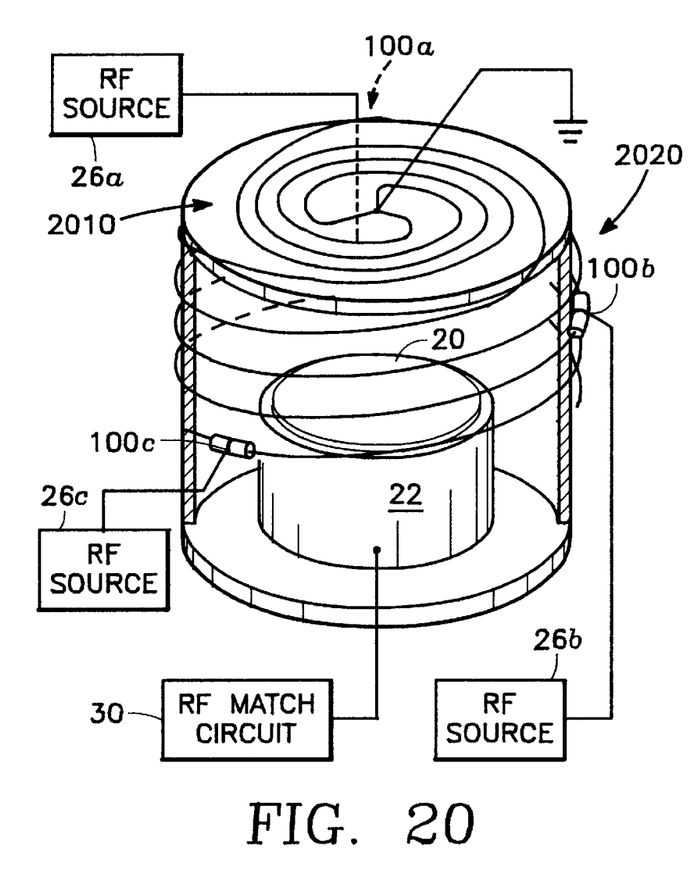
Figure 21:
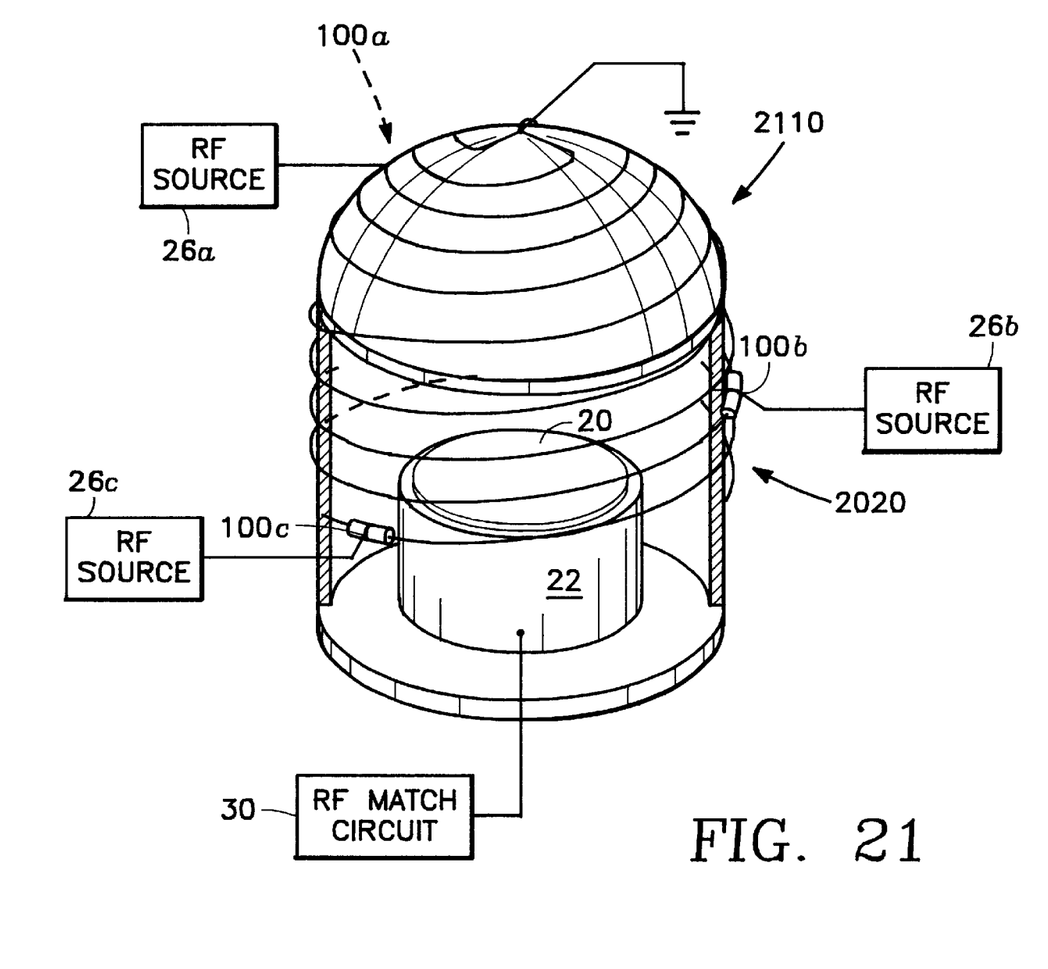

Referring to FIG. 18, the coil antenna 24 may comprise plural (e.g., three) concentrically wound conductors 1810, 1820, 1830 having a common apex point 1840 connected to ground and three ends 1810a, 1820a, 1830a symmetrically disposed around the outer circumference of the coil antenna. In the implementation of FIG. 18, the three ends 1810a, 1820a, 1830a are connected to the RF source 26 by three slide connector rings 100a, 100b, 100c, respectively. While the embodiment of FIG. 18 is a flat discoid coil, FIG. 19 illustrates how the plural concentric windings may have a cylindrical shape. FIG. 20 illustrates how the embodiments of FIGS. 18 and 19 may be combined to provide a flat top discoid winding 2010 and a cylindrical side winding 2020. The embodiment of FIG. 21 comprises a dome-shaped top 2110 consisting of plural concentric windings. As illustrated in FIG. 21, the dome-shaped top 2110 may be combined with the cylindrical side winding 2020 of FIG. 20. The embodiments of FIGS. 18–21 incorporate inventions disclosed in U.S. application Ser. No. 08/332,569 filed Oct. 31, 1994 by Zue-Yu Qian et al. entitled "Inductively Coupled Plasma Reactor with Symmetrical Parallel Multiple Coils Having a Common RF Terminal" and assigned to the present assignee, the disclosure of which is incorporated herein by reference.

While the invention has been described in detail by specific reference to preferred embodiments, it is understood that variations and modifications thereof may be made without departing from the true spirit and scope of the invention.

What is claimed is:

1. A plasma reactor for processing a substrate, comprising:

a reactor chamber having an ionizable gas located within said chamber;

a variable frequency RF power source;

an RF antenna connected to said RF power source for coupling RF power to said ionizable gas to produce a plasma therefrom;

a power sensor connected to said RF antenna for sensing transmitted power to said plasma; and a controller coupled to said variable frequency RF power source for regulating the frequency of said variable frequency RF power source in response to said power sensor.

2. The reactor of claim 1 wherein said power sensor senses reflected power to said source.

3. The reactor of claim 1 further comprising a fixed RF match circuit comprising at least one reactive component connected to said RF antenna.

4. The reactor of claim 1 further comprising a movable RF connector on said RF antenna, said movable RF connector being translatable along the length of said RF antenna, said variable frequency RF power source being connected to said RF antenna at said movable RF connector.

5. The reactor of claim 4 wherein the location of said movable RF connector and a reactance of said reactive component provide an initial RF match of said variable frequency RF power source.

6. The reactor of claim 1 further comprising an RF bias source, a wafer pedestal within said chamber and a bias RF match circuit connected between said RF bias source and said wafer pedestal.

7. The reactor of claim 6 wherein said RF bias source has a fixed RF frequency and said bias RF match circuit provides an RF match of said RF bias source to said wafer pedestal at said fixed RF frequency of said RF bias source.

8. The reactor of claim 6 wherein:
said reactive component comprises a capacitor connected between one end of said RF antenna and ground;
an opposite end of said RF antenna is connected directly to ground; and
said movable connector is located between said ends of said antenna.

9. The reactor of claim 1 wherein said control circuit comprises a computer programmed monitor coupled to said power sensor and to change said frequency of said variable frequency RF power source so as to effect one of: (a) minimizing said reflected power and (b) maximizing said transmitted power.

10. The reactor of claim 9 wherein said computer is programmed to determine which one of an increase or decrease in frequency minimizes reflected power and to change the frequency of said variable frequency RF power source until said reflected power is minimized.

11. The reactor of claim 8 wherein said antenna comprises an inductive coil antenna and wherein said reactor is an inductively coupled plasma reactor.

12. The plasma reactor of claim 1 wherein said RF antenna comprises a top coil section overlying said chamber and a side coil section surrounding a portion of said chamber.

13. The plasma reactor of claim 12 wherein said top and side coil sections comprise a single winding.

14. The plasma reactor of claim 12 wherein said top and side coil sections are separately connected to said RF power source.

15. The plasma reactor of claim 1 wherein said RF antenna comprises plural coil sections, adjacent ones of said plural coil sections being oppositely wound and having a common connection therebetween.

16. The plasma reactor of claim 15 wherein said common connection is connected to said RF power source.

17. The plasma reactor of claim 15 wherein there are plural pairs of adjacent coil sections with plural common connections therebetween, alternate ones of said common connections being connected to said RF power source and remaining ones of said common connections being connected to ground.

18. The plasma reactor of claim 1 wherein said RF antenna comprises plural concentric windings having a common apex connection and respective ends.

19. The plasma reactor of claim 18 wherein said common apex connection is connected to one of (a) said RF power source and (b) ground, and wherein said respective ends are connected to the other one of (a) said RF power source and (b) ground.

20. The plasma reactor of claim 18 wherein said RF antenna comprises a dome structure of said plural concentric windings.

21. The plasma reactor of claim 18 wherein said RF antenna comprises a flat disk of said plural concentric windings.

22. The plasma reactor of claim 18 wherein said RF antenna comprises a cylindrical structure of said plural concentric windings.

23. The plasma reactor of claim 18 wherein said RF antenna comprises a cylindrical structure of plural concentric windings underlying one of (a) a dome structure of plural concentric windings and (b) a disk structure of plural concentric windings.

24. A method of operating a plasma reactor for processing a substrate having a reactor chamber, an RF antenna adjacent said reactor chamber, and ionizable gas located within the chamber, said method comprising the steps of:
ionizing said gas within said chamber by providing RF power from a variable frequency RF power source to said RF antenna;
sensing transmitted power to said plasma; and
regulating the frequency of said variable frequency RF power source in response to said sensing step.

25. The method of claim 24 wherein said sensing step senses reflected power to said source.

26. The method of claim 24 wherein said regulating step regulates the frequency of said variable frequency RF power source so as to effect at least one of: (a) an increase in transmitted power and (b) a decrease in reflected power.

27. The method of claim 26 wherein said regulating step effects one of: (a) maximizing said transmitted power and (b) minimizing said reflected power.

28. The method of claim 24 wherein said RF antenna comprises a movable RF connector translatable along the length of said RF antenna, said RF power source being connected to said RF antenna at said movable RF connector, and wherein said reactor further comprises a fixed RF match circuit comprising at least a reactive element connected to said RF antenna, said method further comprising initially obtaining an RF match by translating said movable connector until one of: (a) said transmitted power is maximized and (b) said reflected power is minimized.

29. The method of claim 24 wherein said reactor comprises a wafer pedestal in said chamber for supporting said wafer, said method further comprising applying a bias RF power to said wafer pedestal at a fixed frequency through an RF match circuit.

30. The method of claim 26 wherein said regulating step comprises determining which one of an increase and a decrease in the frequency of said RF source provides a decrease in said reflected power and performing the one of said increase or decrease in said frequency until said reflected power reaches a minimum.

31. The method of claim 26 wherein said regulating step so as to effect a decrease in said reflected power comprises:
(a) initially sampling said reflected power, incrementing said frequency of said RF power source by a selected amount, secondarily sampling said reflected power in response to said incremented frequency, and repeating said incrementing step and said secondarily sampling step until said secondarily sampled reflected power is greater than said initially sampled reflected power; and
(b) initially sampling said reflected power, decrementing said frequency of said RF power source by a selected amount, secondarily sampling said reflected power in response to said decremented frequency, and repeating said decrementing step and said secondarily sampling step until said secondarily sampled reflected power is greater than said initially sampled reflected power; and
(c) successively repeating steps (a) and (b).

32. The method of claim 26 wherein said regulating step so as to effect an increase in said transmitted power comprises:

(a) initially sampling the transmitted power, incrementing said frequency of said RF power source by a selected amount, secondarily sampling said transmitted power in response to said incremented frequency, and repeating said incrementing step said secondarily sampling step until said secondarily sampled transmitted power is less than said initially sampled transmitted power; and (b) initially sampling said transmitted power, decrementing said frequency of said RF power source by a selected amount, secondarily sampling said transmitted power in response to said decremented frequency, and repeating said decrementing step and said secondarily sampling step until said secondarily sampled transmitted power is less than said initially sampled transmitted power; and (c) successively repeating steps (a) and (b).

* * * * *